(12) United States Patent
Huang

(10) Patent No.: US 7,362,568 B2
(45) Date of Patent: Apr. 22, 2008

(54) HEAT SPREADER WITH FILTERING FUNCTION AND ELECTRICAL APPARATUS

(75) Inventor: Huang-Yuan Huang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 365 days.

(21) Appl. No.: 11/116,404

(22) Filed: Apr. 28, 2005

(65) Prior Publication Data

US 2005/0248920 A1 Nov. 10, 2005

(30) Foreign Application Priority Data

May 10, 2004 (TW) .............................. 93113104 A

(51) Int. Cl.
*H05K 7/20* (2006.01)

(52) U.S. Cl. .................. 361/687; 361/694; 361/695; 361/697

(58) Field of Classification Search .................. None
See application file for complete search history.

(56) References Cited

U.S. PATENT DOCUMENTS

| | | | |
|---|---|---|---|
| 6,754,077 B2 * | 6/2004 | Lo et al. ...................... | 361/700 |
| 2004/0252455 A1 * | 12/2004 | Yi-Lung ...................... | 361/687 |
| 2006/0039113 A1 * | 2/2006 | Cheng et al. ............... | 361/700 |
| 2007/0131383 A1 * | 6/2007 | Hattori et al. .............. | 165/11.2 |

FOREIGN PATENT DOCUMENTS

| | | |
|---|---|---|
| CN | 2583936 Y | 10/2003 |
| TW | 524429 A | 2/1990 |

* cited by examiner

*Primary Examiner*—Gregory D Thompson
(74) *Attorney, Agent, or Firm*—Birch, Stewart, Kolasch & Birch, LLP

(57) ABSTRACT

A heat spreader with a filtering function is set in a case of an electrical apparatus. The heat spreader includes a heat sink set and a filter unit. The heat sink set is set in the case. The filter unit is set in the case and is adjacent to the heat sink set. In addition, an electrical apparatus includes a case and a filter unit, and a heat spreader is set in the electrical apparatus. The filter unit is set in the case and is adjacent to the heat spreader.

17 Claims, 7 Drawing Sheets

HEAT SPREADER WITH FILTERING FUNCTION AND ELECTRICAL APPARATUS

BACKGROUND OF THE INVENTION

1. Field of Invention

The invention relates to a heat spreader and an electrical apparatus and, in particular, the invention relates to a heat spreader and an electrical apparatus with a filtering function.

2. Related Art

With the rapid development in the integrated circuit (IC) manufacturing technology, electronic elements have higher operating speeds. As a result, a huge amount of heat will be generated when electronic elements are running at high frequencies. If such heat is not removed, the temperature of the electronic element will continuously rise to reach a threshold temperature that affects the operation stability of the electronic element. More seriously, the electronic element may be burned out.

An information processing device, such as an electrical apparatus, consists of many different electronic elements. Since the electrical apparatus is frequently used, many of its interior elements have low efficiency due to long-time using. Take a fan, shown in FIG. 1, as an example. To maintain the operational stability of the electrical apparatus 5, a heat spreader 6 is usually set in it. The heat spreader 6 includes a fan 61 and a heat sink set 62. The fan 61 provides a circulating air current to the heat sink set 62 to remove the heat generated by operating electronic elements (e.g. the CPU). This ensures the efficiency and stability of the overall electrical apparatus 5.

The fan 61 of the electrical apparatus 5 may have dusts adhered to the heat sink set 62 after a period of time. In this case, the heat dissipating rate of the heat sink set 62 becomes worse. This eventually results in being unable to remove the heat generated by the electronic elements (e.g. the CPU), therefore rendering a low efficiency. The most serious situation is that the electrical apparatus 5 breaks down.

For removing dusts on the heat sink set 62, a user may have to send the electrical apparatus 5 to a service center. This method takes a longer time. The user has to wait and withstand the time without the electrical apparatus 5. On the other hand, when the service center tries to remove the accumulated dusts on the heat sink set 62, the case of the electrical apparatus 5 along with other electronic elements need to be taken off before they take out the heat sink set 62 locked on the case of the electrical apparatus 5. Afterwards, they clean the dusts on the heat sink set 62 using a brush. Finally, the heat sink set 62 is locked back on the electrical apparatus 5.

This kind of dissembling method inevitably takes the maintenance worker some time to take the electrical apparatus 5 apart. If the electrical apparatus 5 is usually functioning in a dusty environment, the dust accumulation on the heat sink set 5 is faster. Therefore, the user has to clean the dusts thereon very often in order to the functioning of the electrical apparatus 5 normally. As said before, it will take a lot of time to take the heat spreader 6 apart. Therefore, it is a tedious and time-consuming job.

Consequently, it is an important subjective to provide a heat spreader for solving the above-mentioned problem so that a user can readily take off the heat sink set and remove the dusts thereon.

SUMMARY OF THE INVENTION

In view of the foregoing, the invention is to provide a heat spreader and an electrical apparatus with a filtering function, which can avoid over-accumulation of dusts on a heat sink set.

Moreover, the invention is to provide a heat spreader and an electrical apparatus with a filtering function, so that the user can clean the ducts on the heat spreader by him or her.

To achieve the above, an electrical apparatus of the invention has a heat spreader configured therein and includes a case and a filter unit. The filter unit is installed inside the case and adjacent to the heat spreader.

The invention also discloses a heat spreader with a filtering function, which is installed inside a case of an electrical apparatus. The heat spreader includes a heat sink set and a filter unit. The heat sink set is installed inside the case. The filter unit is configured in the case and adjacent to the heat sink set.

As mentioned above, the heat spreader with a filtering function of the invention uses a filter unit to avoid the accumulation of dusts on the heat sink set. Therefore, it keeps the heat dissipation effect of the heat sink set and functions of other elements of an electrical apparatus (e.g. the CPU) as well. Since the user can simply remove the dusts on the filter unit, the electrical apparatus does not need to be sent for services, which can save time and money for the user.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
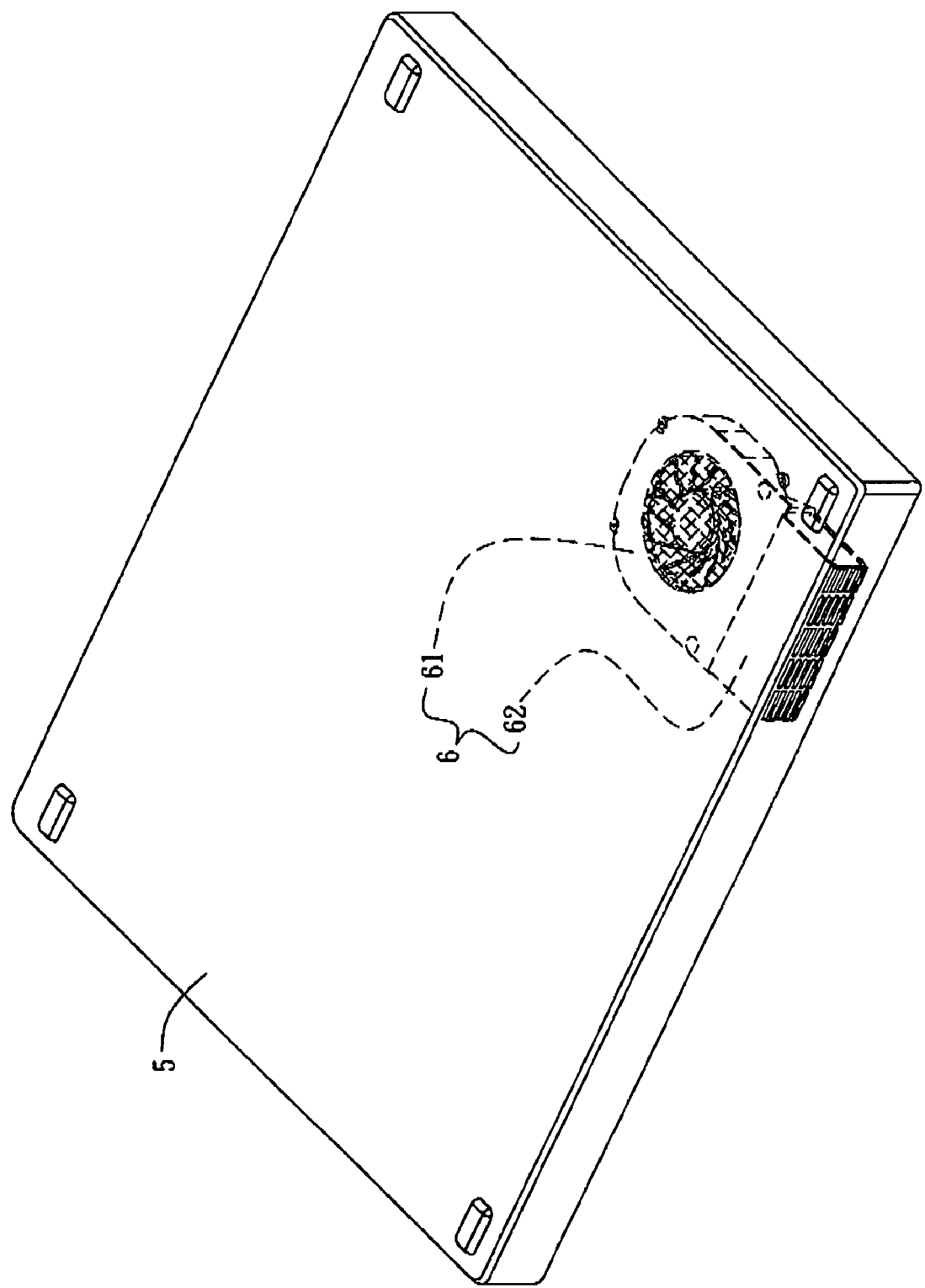
FIG. 1 is a schematic view of a conventional electrical apparatus and a conventional heat spreader.
Figure 2:
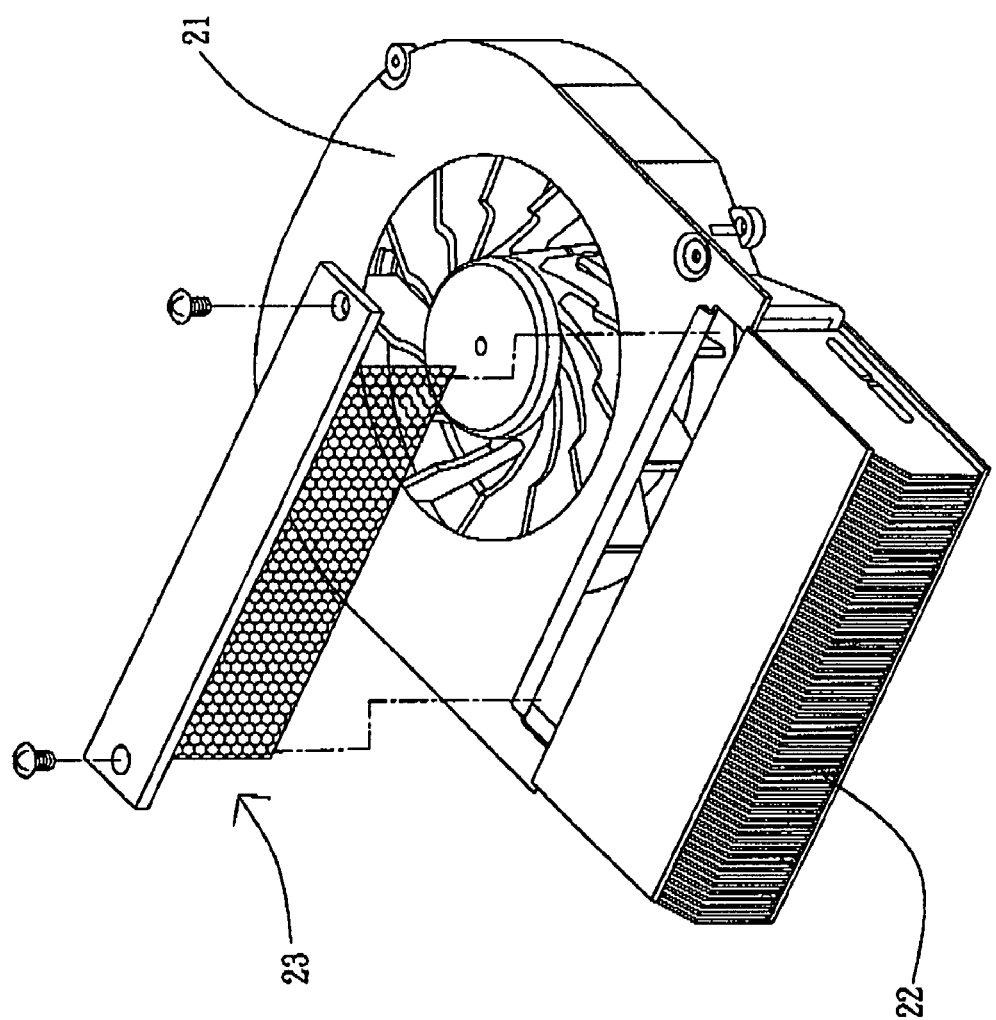
FIG. 2 is a schematic view of a heat spreader with a filtering function according to a preferred embodiment of the invention.

As shown in FIG. 2, a heat spreader 2 with a filtering function according to a preferred embodiment of the invention includes a heat sink set 22 and a filter unit 23. The heat spreader 2 is installed inside a case 11 of an electrical apparatus 1, as illustrated in FIG. 3.

Figure 3:
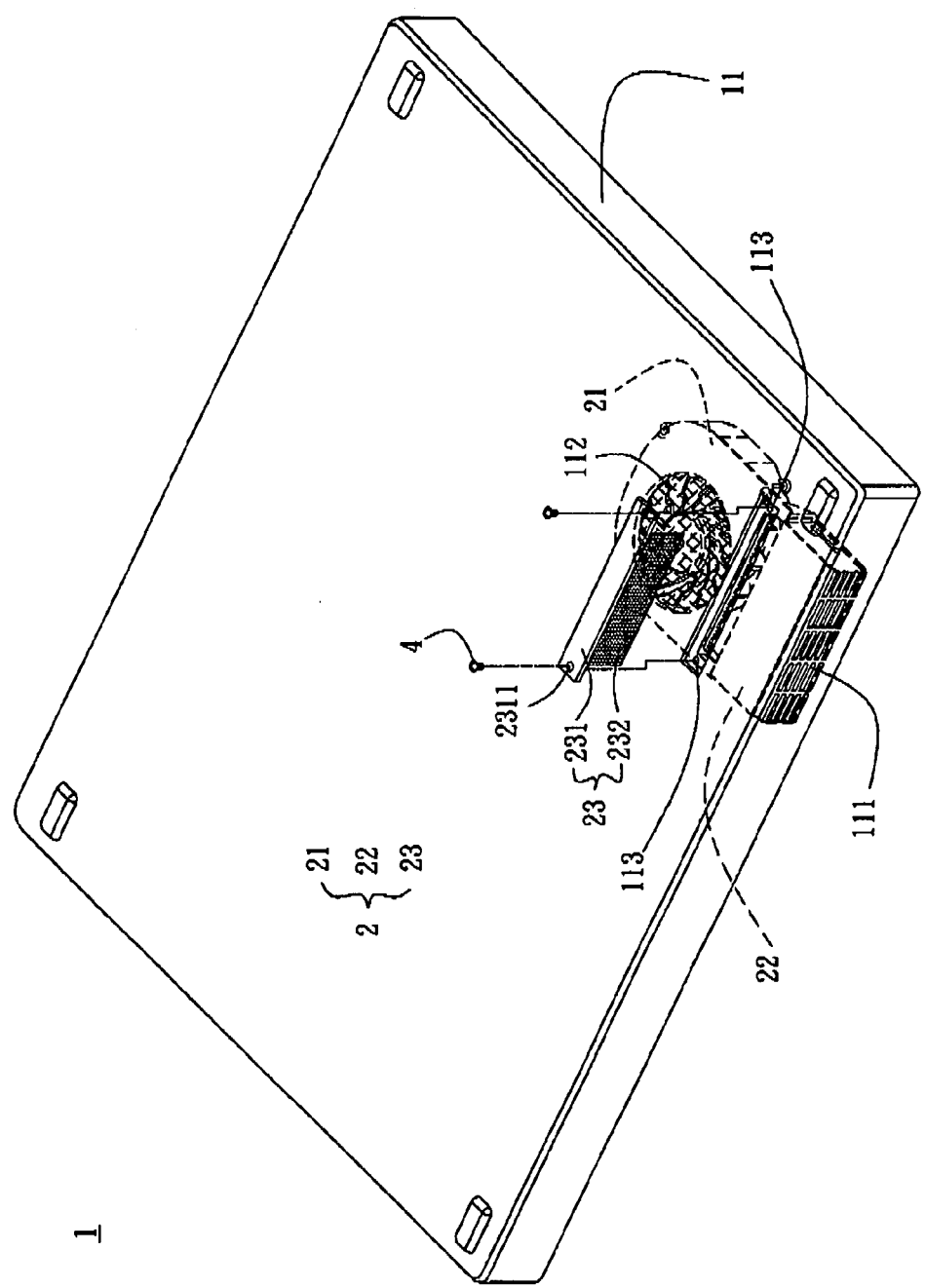
FIG. 3 is a schematic view of an electrical apparatus and a heat spreader with a filtering function according to a preferred embodiment of the invention.

With reference to FIG. 3, a fan 21 is installed inside the case 11. The case 11 further has a first opening 111 and a second opening 112. The first opening 111 is the outlet of the fan 21, and the second opening 112 is the inlet of the fan 21. The heat sink set 22 is installed inside the case 11 and is adjacent to the first opening 111. The filter unit 23 is installed inside the case 11 and is adjacent to the heat sink set 22. In this embodiment, the filter unit 23 is located between the fan 21 and the heat sink set 22. The fan 21 is installed inside the case 11 and is adjacent to the second opening 112. The heat sink set 22 is installed inside the case 11 and is adjacent to both the fan 21 and the first opening 111. The filter unit 23 is installed between the fan 21 and the heat sink set 22. In this embodiment, the heat sink set 22 is a heat-dissipating fin set.

Figure 4:
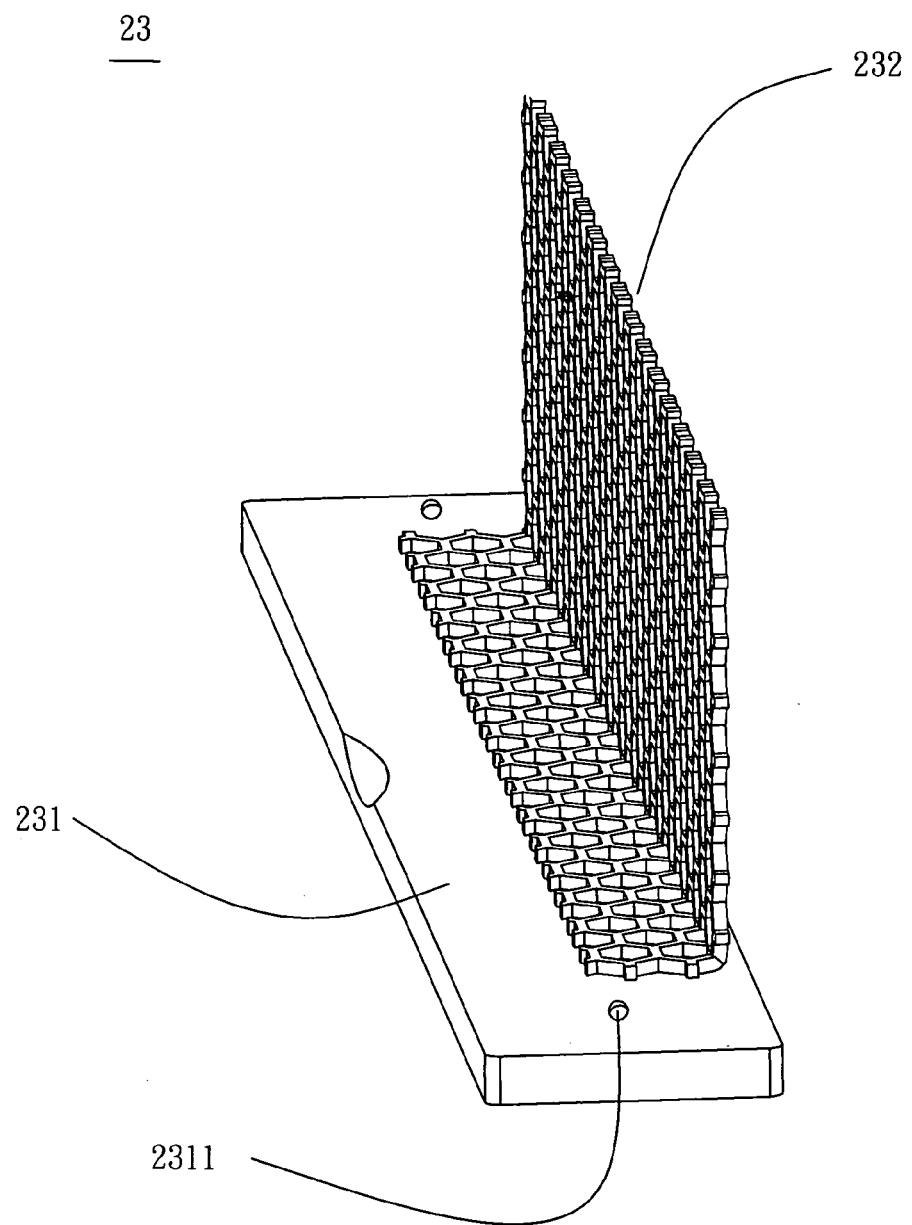
FIG. 4 is a schematic view of a filter unit according to a preferred embodiment of the invention.

As shown in FIG. 4, the filter unit 23 includes a fixing plate 231 and a filter 232. The filter 232 is installed on the fixing plate 231. That is, the filter 232 is fixed on the fixing plate 231 by a way of adhesion or screw locking. In the current embodiment, the material of the fixing plate 231 can be plastic or metal, and the filter 232 can be a metal filter or a plastic filter.

Figure 5A:
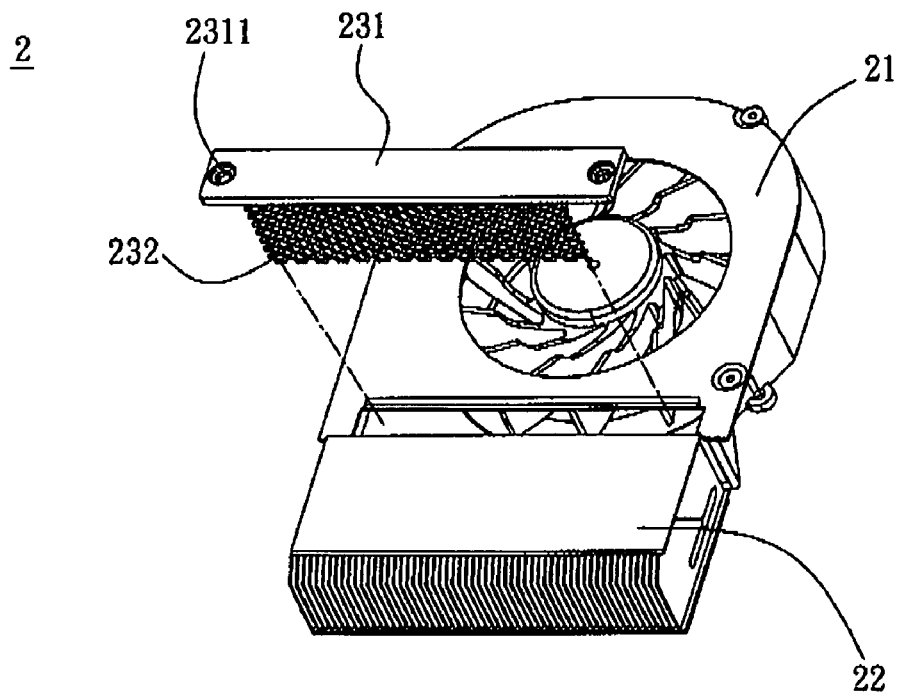
FIGS. 5a and 5b are schematic views of assembling a heat spreader with a filtering function according to a preferred embodiment of the invention.
Figure 5B:
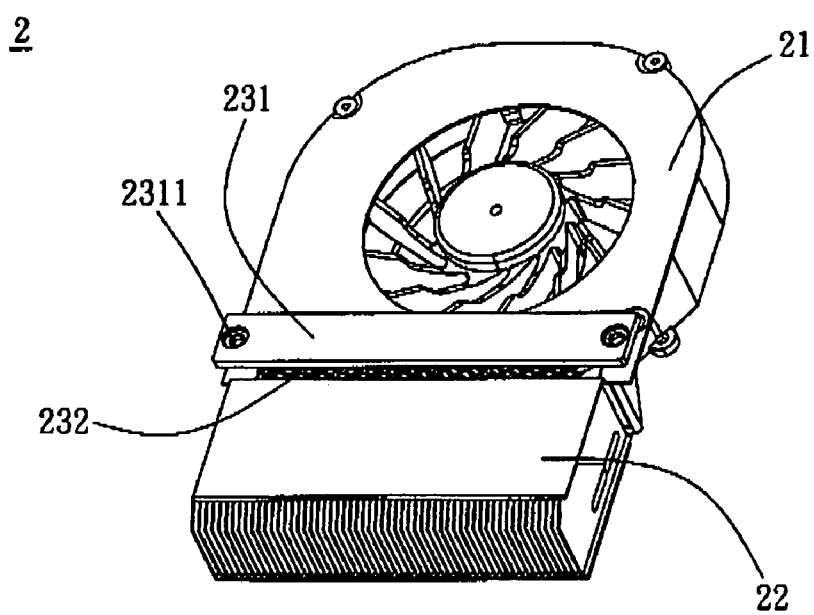

The heat spreader 2 according to the embodiment of the invention will be apparent from the following detailed description. As shown in FIGS. 5a and 5b, the filter 232 is installed between the fan 21 and the heat sink set 22. The filter 232 can effectively block dusts so that they do not accumulate on the heat sink set 22. The fixing plate 231 has at least one first through hole 2311. As shown in FIG. 3, the case 11 has at least one second through hole 113 corresponds to the first through hole 2311. A screw 4 goes through the first through hole 2311 and second through hole 113, so as to fix the fixing plate onto the case 11. In this embodiment, the fixing plate 231 has two first through holes 2311 and the case 11 has two second through holes 113.

Hereinafter, another embodiment of the invention will be described with reference to FIG. 3.

As shown in FIG. 3, which shows an electrical apparatus 1 according to another embodiment of the invention, a heat spreader is provided inside the electrical apparatus 1. In this embodiment, the heat spreader is a heat sink set 22. Herein, the electrical apparatus 1 includes a case 11 and a filter unit 23. The filter unit 23 is installed inside the case 11 and is adjacent to the heat spreader. A fan 21 is provided inside the case 11. The configurations and assemblies of the fan 21, case 11, heat sink set 22 and filter unit 23 in the current embodiment are the same as those mentioned previously, so the detailed descriptions are omitted for concise purpose.

Figure 6:
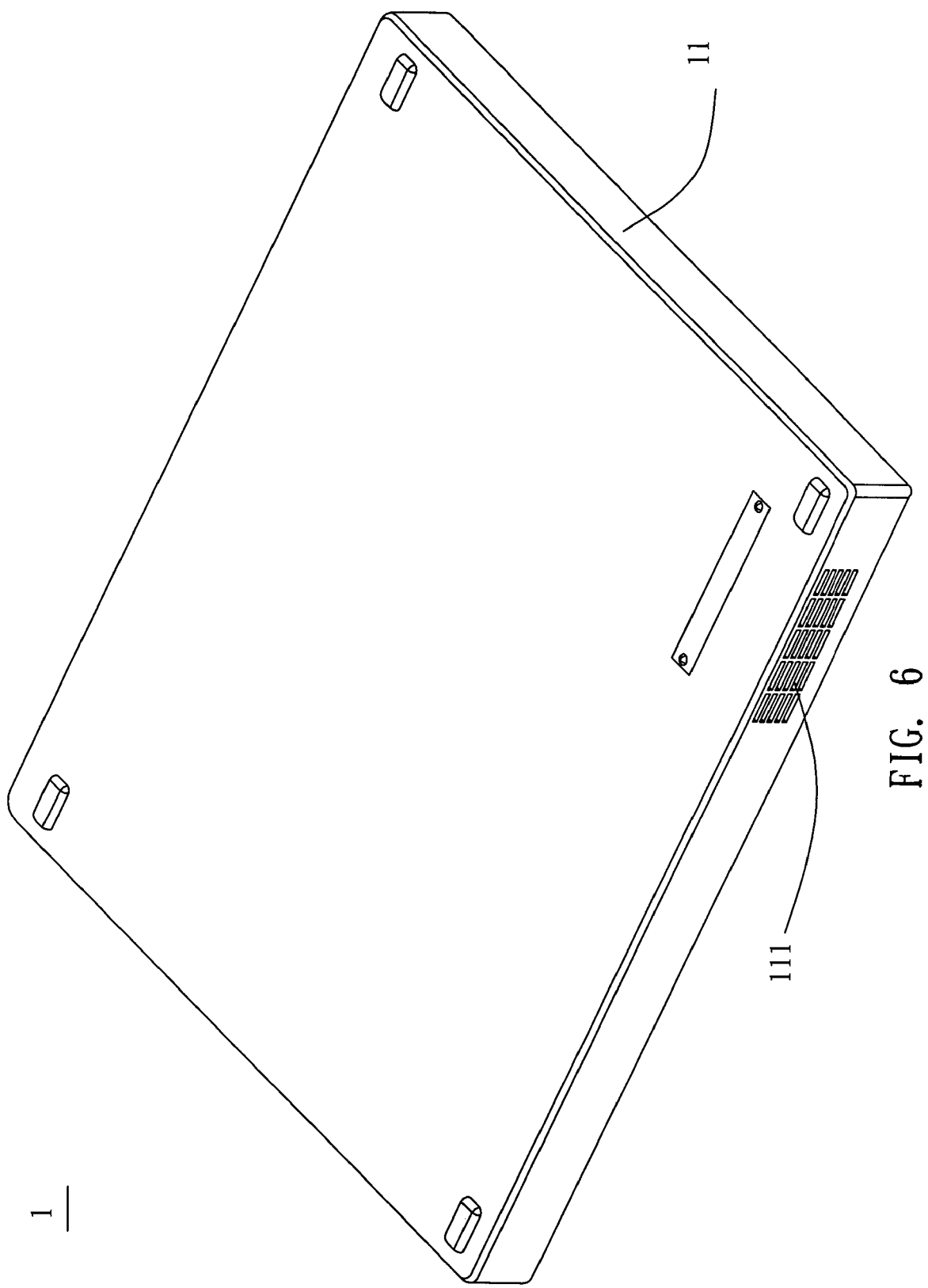
FIG. 6 is a schematic view showing the bottom of an electrical apparatus according to another embodiment of the invention.
Figure 7:
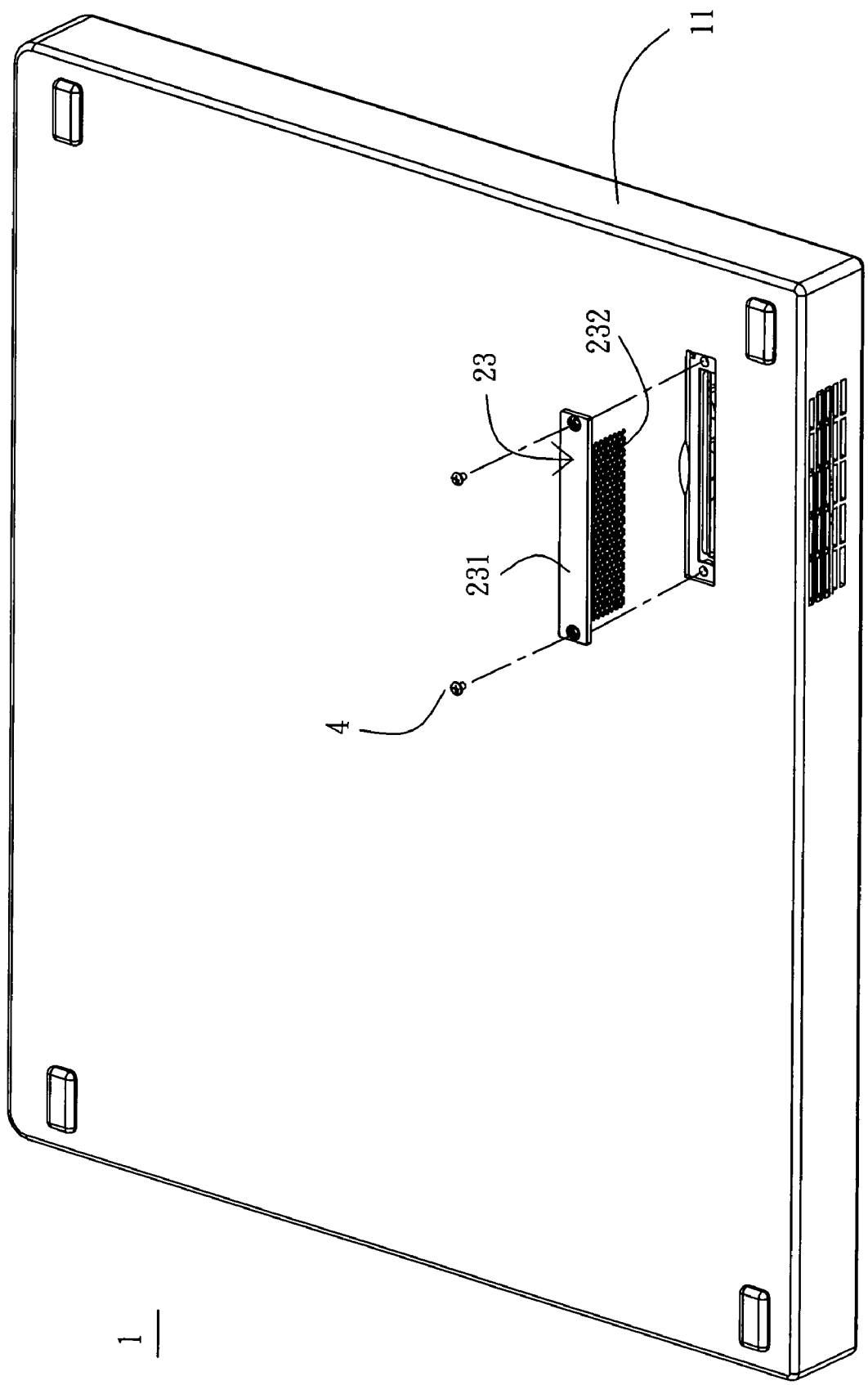
FIG. 7 is a schematic view of assembling an electrical apparatus and a filter unit according to another embodiment of the invention.

As shown in FIG. 6, the electrical apparatus 1 is a laptop computer in the current embodiment. In other words, the case 11 is the case of a laptop computer. The first opening 111 is an outlet. As shown in FIG. 7, when a user wants to clean dusts accumulated on the filter unit 23, he or she then uses a screwdriver to unlock the screw 4 on the fixing plate 231 and the case 11. Afterwards, the filter unit 23 is removed from the electrical apparatus 1 by hands. A brush is then used to sweep the dusts accumulated on the metal filter 232. Finally, the cleaned filter unit 23 is locked back to the case 11.

In summary, the heat spreader with a filtering function uses a filter unit to avoid the accumulation of dusts on the heat sink set. Therefore, it keeps the heat dissipation effect of the heat sink set and functions of other elements in the electrical apparatus as well. Since the filter unit is locked on the case, the user can readily uninstall the filter unit and remove the dusts thereon. Thus, the electrical apparatus does not need to be sent for services.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrical apparatus with a heat spreader installed therein, comprising:
   a case; and
   a filter unit installed inside the case and adjacent to the heat spreader, wherein the filter unit comprises a fixing plate and a filter, the filter is installed on the fixing plate, and the fixing plate is fixed inside the case, the fixing plate has at least a first through hole, the case has at least a second through hole corresponding to the first through hole, and a screw goes through the first through hole and the second through hole to fix the fixing plate on the case.

2. The electrical apparatus of claim 1, which is a laptop computer.

3. The electrical apparatus of claim 1, wherein the heat spreader is a heat sink set.

4. The electrical apparatus of claim 1, wherein the case has a first opening, a fan is installed inside the case, the first opening is the outlet of the fan, the heat spreader is installed inside the case and adjacent to the first opening, and the filter unit is located between the fan and the heat spreader.

5. The electrical apparatus of claim 4, wherein the case further has a second opening as the inlet of the fan.

6. The electrical apparatus of claim 1, wherein the filter is fixed onto the fixing plate in a way selected from adhesion and screw locking.

7. The electrical apparatus of claim 1, wherein the heat sink set is a heat-dissipating fin set.

8. The electrical apparatus of claim 1, wherein the material of the fixing plate is selected from plastic and metals.

9. The electrical apparatus of claim 1, wherein the filter is selected from a metal filter and a plastic filter.

10. The electrical apparatus of claim 1, wherein the case is a case of a laptop computer.

11. A heat spreader with a filtering function installed inside a case of an electrical apparatus, comprising:
    a heat sink set installed inside the case; and
    a filter unit installed inside the case and adjacent to the heat sink set, wherein the filter unit comprises a fixing plate and a filter, the filter is installed on the fixing plate, and the fixing plate is fixed inside the case, the fixing plate has at least a first through hole, the case has at least a second through hole corresponding to the first through hole, and a screw goes through the first through hole and the second through hole to fix the fixing plate on the case.

12. The heat spreader of claim 11, wherein the case has a first opening, a fan is installed inside the case, the first opening is the outlet of the fan, the heat sink set is adjacent to the first opening, and the filter unit is located between the fan and the heat sink set.

13. The heat spreader of claim 12, wherein the case further has a second opening as the inlet of the fan.

14. The heat spreader of claim 11, wherein the filter is fixed onto the fixing plate in a way selected from adhesion and screw locking.

15. The heat spreader of claim 11, wherein the heat sink set is a heat-dissipating fin set.

16. The heat spreader of claim 11, wherein the material of the fixing plate is selected from plastic and metals.

17. The heat spreader of claim 11, wherein the filter is selected from a metal filter and a plastic filter.

* * * * *